(12) United States Patent
Hinterberger et al.

(10) Patent No.: US 11,519,968 B2
(45) Date of Patent: Dec. 6, 2022

(54) MEASUREMENT ARRANGEMENT, HIGH-VOLTAGE BATTERY, MOTOR VEHICLE AND METHOD FOR DETERMINING A COMPLEX IMPEDANCE

(71) Applicant: AUDI AG, Ingolstadt (DE)

(72) Inventors: Michael Hinterberger, Großmehring (DE); Christian Endisch, Geisenfeld (DE); Christoph Terbrack, Ingolstadt (DE); Bernhard Liebhart, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 265 days.

(21) Appl. No.: 16/724,750

(22) Filed: Dec. 23, 2019

(65) Prior Publication Data

US 2020/0225291 A1    Jul. 16, 2020

(30) Foreign Application Priority Data

Jan. 16, 2019    (DE) .................... 10 2019 200 510.1

(51) Int. Cl.
*G01R 31/389* (2019.01)
*G01R 31/385* (2019.01)
*G01R 31/396* (2019.01)

(52) U.S. Cl.
CPC ......... *G01R 31/389* (2019.01); *G01R 31/386* (2019.01); *G01R 31/396* (2019.01)

(58) Field of Classification Search
CPC ... G01R 31/389; G01R 31/396; G01R 31/386
(Continued)

(56) References Cited

U.S. PATENT DOCUMENTS

| 7,148,708 | B1 | 12/2006 | Potempa |
| 2006/0017444 | A1* | 1/2006 | Fechalos ............... G01R 31/379 324/433 |

(Continued)

FOREIGN PATENT DOCUMENTS

| CN | 2648675 Y | 10/2004 |
| CN | 102457083 A | 5/2012 |

(Continued)

OTHER PUBLICATIONS

Examination Report dated Oct. 22, 2019 in corresponding German application No. 10 2019 200 510.1; 16 pages including Machine-generated English-language translation.
(Continued)

*Primary Examiner* — Patrick Assouad
*Assistant Examiner* — Trung Q Nguyen
(74) *Attorney, Agent, or Firm* — Maier & Maier, PLLC

(57) ABSTRACT

A measurement arrangement for determining a complex impedance of a first electrical component, wherein the measurement arrangement comprises the first component and a measuring unit, which is coupled to the first component and adapted to determine the complex impedance of the first component. The measurement arrangement comprises at least one second electrical component, which is arranged with the first component in a parallel circuit, which is hooked up in parallel with the measuring unit, wherein the parallel circuit comprises at least one switching device by which an electrical connection between the first and second component can be broken, and wherein the measurement arrangement is designed to temporarily break the electrical connection between the first component and the second component by the associated switching device in order to determine the first complex impedance of the first component.

15 Claims, 3 Drawing Sheets

(58) Field of Classification Search
USPC .................................................. 324/400–450
See application file for complete search history.

(56) References Cited

U.S. PATENT DOCUMENTS

| | | | |
|---|---|---|---|
| 2017/0131363 A1 | 5/2017 | Scott et al. | |
| 2019/0115762 A1* | 4/2019 | Marsili | G01R 31/3842 |
| 2020/0132781 A1* | 4/2020 | Marsili | G01R 31/389 |

FOREIGN PATENT DOCUMENTS

| | | |
|---|---|---|
| CN | 102640336 A | 8/2012 |
| CN | 103503223 A | 1/2014 |
| CN | 103825322 A | 5/2014 |
| CN | 104181395 A | 12/2014 |
| CN | 204190446 U | 3/2015 |
| CN | 207601280 U | 7/2018 |
| CN | 108663631 A | 10/2018 |
| DE | 10 2013 218 077 A1 | 3/2015 |
| DE | 10 2013 218 081 A1 | 3/2015 |
| DE | 11 2016 002 067 T5 | 1/2018 |
| DE | 10 2017 210 618 A1 | 12/2018 |
| EP | 3203252 A1 | 8/2017 |
| JP | 200972038 A | 4/2009 |
| JP | 201396803 A | 5/2013 |

OTHER PUBLICATIONS

Office Action dated Nov. 25, 2021, in connection with corresponding Chinese Application No. 202010030346.1 (27 pp., including machine-generated English translation).

Office Action dated Mar. 31, 2022, in connection with corresponding Chinese Application No. 202010030346.1 (21 pp., including machine-generated English translation).

* cited by examiner

MEASUREMENT ARRANGEMENT, HIGH-VOLTAGE BATTERY, MOTOR VEHICLE AND METHOD FOR DETERMINING A COMPLEX IMPEDANCE

FIELD

The disclosure relates to a measurement arrangement for determining a complex impedance of an electrical component, such as a battery cell, wherein the measurement arrangement comprises the electrical component and a measuring unit which is coupled to the electrical component, and which is adapted to determine the complex impedance of the electrical component. The disclosure also includes a high-voltage battery, a motor vehicle and a method for determining a complex impedance of an electrical component.

BACKGROUND

A battery cell is no ideal voltage source, but rather an electrochemical system which can provide a limited energy and power on account of internal resistances or dynamic processes. The resistance can be calculated from current and voltage values.

In order to measure the alternating current resistance, also known as the impedance, as a complex value function of the frequency, the battery or the battery cell is deliberately excited at the poles. In this way, an entire impedance spectrum can be plotted, reflecting the electrical behavior of the battery cell as a transfer function, and often being approximated by an equivalent electrical diagram. By applying an impedance measuring device, such as the aforementioned measuring unit, it is possible to carry out an electrochemical impedance spectroscopy, also known in short as EIS, or an impedance determination in general on battery cells. However, in the impedance spectroscopy or impedance determination, one need not necessarily determine impedances for different excitation frequencies, but rather only a single impedance value can be determined for a given frequency.

For example, DE 11 2016 002 067 T5 describes a method for monitoring a battery system having a plurality of battery cell units, wherein based on measurement data at least one power-dependent parameter is determined for each of the battery cell units. A battery cell unit here comprises two parallel-connected battery cells. As the parameter, one can determine for example the impedance of a respective battery cell unit.

Furthermore, DE 10 2013 218 081 A1 describes a battery module device having a battery module with multiple serial and/or parallel connected battery cells and a monitoring device for monitoring the state of the battery module. In an impedance spectroscopy mode, the battery module can be subjected to measuring currents in order to carry out an impedance spectroscopy of the battery module. From this, a complex impedance of the battery module can be determined. The current and/or the voltage for each individual cell can also be detected and from this an overall voltage or an overall current can be determined in order to calculate the complex impedance of the battery module, but not that of an individual battery cell.

Furthermore, DE 10 2013 218 077 A1 describes a battery cell device having a battery cell and a monitoring device for monitoring the state of the battery cell. In an impedance spectroscopy mode, the battery cell can be subjected to measuring currents in order to carry out an impedance spectroscopy of the battery cell and from this a complex impedance of the battery cell can be determined.

SUMMARY

Thus, it is possible either to determine only the complex impedance of an individual battery cell or, in the event that such a battery cell finds itself in a cell arrangement with multiple battery cells, only the impedance of such an overall arrangement by means of a measuring unit.

The problem which the present invention proposes to solve is therefore to provide a measurement arrangement, a high-voltage battery, a motor vehicle and a method for determining a complex impedance of an electrical component, by means of which a determination of the complex impedance of the electrical component is made possible, even when the electrical component is in a layout with other electrical components.

This problem is solved by a measurement arrangement, a high-voltage battery, a motor vehicle and a method having the features according to the respective independent patent claims. Advantageous embodiments of the invention are the subject matter of the dependent patent claims, the specification, and the figures.

A measurement arrangement according to the invention for determining a first complex impedance of a first electrical component comprises the first component and a measuring unit, which is coupled to the first component and adapted to determine the first complex impedance of the first electrical component, in particular by impedance spectroscopy. The measurement arrangement comprises at least one second electrical component, which is arranged with the first component in a parallel circuit, which is in turn hooked up in parallel with the measuring unit, wherein the parallel circuit comprises at least one switching device by means of which an electrical connection between the first electrical component and the at least one second electrical component can be broken, and wherein the measurement arrangement is designed to temporarily break the electrical connection between the first electrical component and the at least one second electrical component by means of the associated switching device in order to determine the first complex impedance of the first electrical component.

As mentioned at the outset, the electrical components may be battery cells, however the described measurement arrangement and also the method yet to be described for the determining of the impedance may be applied entirely analogously to any given kind of electrical component whose impedances are to be determined and which find themselves in a parallel circuit.

The invention is based on several facts. First of all, cells or in general the aforementioned electrical components can be connected both in series and in parallel in a battery system in order to achieve the required power and capacity parameters. In a parallel circuit, the poles of the batteries, that is, of the individual battery cells, are set at the same potential. Hence, it is easily possible to measure individual characteristics in parallel-connected cells, such as the resting voltage and the impedance. In parallel-connected cells, as also in parallel-connected components in general, the current is divided over the cells and the overall impedance of the system, not the individual impedance, can be measured. Accordingly, no such individual measurements of impedances of battery cells are possible when these are found in a cell assemblage, especially in a parallel circuit with other battery cells. According to the present standard configuration of battery systems, only an overall current measurement of the pack current of all battery cells, a voltage measurement of each individual cell, and sporadic temperature measurements can be carried out. In such a configuration, however, no attention is given to the parallel circuit of cells. In general, parallel-connected cells are usually treated as a single large battery cell. However, there are significant differences in the resulting technical capabilities when each individual cell can be identified and characterized in an electrical assemblage of cells. On the other hand, if only the (super) cell consisting of multiple inter-connected single cells can be characterized in the parallel system, this constitutes a significant limitation on the functionality, because each single cell in the parallel system has an individual behavior. For example, the cells may drift apart with increasing age, that is, the internal resistance of a respective battery cell will also change. The invention, on the other hand, makes possible a new dimension, namely, the electrical distinguishing of parallel-connected cells. Furthermore, this is made possible according to the invention in especially easy manner, namely, by a specific switching out of electrical components, such as individual battery cells, by which the parallel system can be divided up. After this, a measurement of each individual electrical component, especially each individual cell, is possible. This advantageously enables a highly accurate determination of the state of all electrical components, especially all the cells in the battery system, which can be done at least according to many advantageous embodiments of the invention without external influencing by other cells, or even by a load, including during operation.

By a load, as shall be often mentioned in the following, is meant in general both an energy sink and an energy source or combinations of these. Thus, such a load may constitute for example an electrical consumer of the motor vehicle, and also for example a charging device of the motor vehicle which can be coupled to an external energy source, an inductive charging unit, the engine of the motor vehicle in generator mode, or the like, by which one or more of the battery cells can be supplied with energy. Accordingly, by a load current is also meant in general a charging current.

In general, the impedance of the first electrical component, or analogously also that of every further component, as described more closely in the following, can be determined as the impedance for a single frequency, especially an excitation frequency, or also for several different frequencies in order to provide an impedance spectrum.

In one advantageous embodiment of the invention, the at least one switching device constitutes a switching device which is associated with at least one second electrical component, by means of which the associated at least one second electrical component can be switched out from the parallel circuit. Furthermore, the measurement arrangement is adapted to switch the at least one second electrical component by means of the associated switching device temporarily out from the parallel circuit in order to determine the first complex impedance of the first electrical component. For example, if the impedance of the first component in the parallel system is to be determined with the at least one second electrical component, the second electrical component can simply be switched out at least temporarily, for example for a given or predeterminable time period or for the duration of the measurement cycle to measure the first electrical component, while the first component is being measured. Thus, the first component can be measured in especially simple fashion.

In one advantageous embodiment of the invention, the first electrical component is also associated with a switching device, by means of which the associated first electrical component can be switched out from the parallel circuit, wherein the measurement arrangement is adapted to determine at least one second complex impedance of the at least one second electrical component and to switch the first electrical component by means of the associated switching device temporarily out from the parallel circuit in order to determine the at least one second complex impedance of the at least one second electrical component.

In other words, the individual impedance of the first component can be determined not only by switching off the at least one second component, but also conversely the complex impedance of the second component can be determined by switching out the first component from the parallel circuit by the associated switching device during the corresponding measurement cycle. The corresponding switching elements may be for example in series with the associated electrical components. Both the first and the second electrical component may thus be advantageously decoupled by switching them off from the rest of the system and the other of the two components can advantageously be measured by the measuring unit. However, there are also still other advantageous possibilities for temporarily breaking up the parallel system, as shall be described in greater detail below. This principle as well as the following further explained examples are not however confined to two electrical components, but rather can be applied quite analogously to any given number of electrical components, especially any given number of individual battery cells.

Accordingly, a further advantageous embodiment of the invention is when the measurement arrangement comprises more than two electrical components, including the first and the at least one second component in the parallel circuit, wherein the measuring unit is adapted to determine separately the complex impedance of a respective component. This can be done in particular as already described, by associating each of these components with a corresponding switching device, especially a switch such as an electronic switch, for example a MOSFET, and then when the complex impedance of a particular one of these multiple components needs to be determined, the other components in the parallel circuit should be decoupled by their associated switching elements, so that an individual measurement of the particular component is possible. In this way, the respective components can advantageously be measured sequentially, for example in a predetermined sequence, that is, their respective associated individual complex impedances can be determined in this way, especially also entire impedance spectra.

In another advantageous embodiment of the invention, the at least one switching device is associated with the first electrical component and hooked up in series with the first electrical component, and the measuring unit has a measuring tap for determining the first complex impedance of the first electrical component, which is arranged between the first electrical component and the switching device associated with the first electrical component, and wherein the measurement arrangement is adapted to switch the first electrical component by means of the associated switching device temporarily out from the parallel circuit in order to determine the first complex impedance of the first electrical component. A second measuring tap of the measuring unit may be located on an opposite side of the first electrical component. In the event of a battery cell as the electrical component, a first measuring tap is thus coupled to a positive cell potential and a second measuring tap to a negative cell potential. Now, because one of the two measuring taps is arranged between the first electrical component and the associated switching device, like the above described switch, the first component being measured can be advantageously switched out from the parallel circuit by opening the associated switching device and then its impedance can be determined by means of the measuring unit without influence from the other second components via the described measuring taps, which also continue to be coupled to the first component when the switching device is opened. In other words, in this way the component being measured can be specifically decoupled from the rest of the parallel system by means of the associated switching device during the measurement phase and then be switched in once more.

Furthermore, in this variant either each of the electrical components, i.e., the first and the at least one second component, can be associated with a corresponding measuring unit, which continues to be coupled to this component even when the switching device of the associated component is open, or also only one measuring unit can be provided, which can be coupled by means of a selector switch unit, such as a kind of multiplexer, in time sequence to the respective measuring taps, which are located between the respective electrical components and their associated switching devices, in order to determine the impedances of the respective components in time sequence. Multiple measuring units have the advantage that the impedances of multiple electrical components can also be determined at the same time, while only a single measuring unit can provide a much more simple and economical design. In either case, however, the ability is advantageously provided to measure a corresponding electrical component also during operation, i.e., when a load current caused by a consumer or also a charging current provided as a load by a charging device is flowing through the parallel circuit, since the component being measured in this variant is decoupled by the associated switching device from the rest of the parallel circuit and thus it is not subjected to the load current and also not to the load influence in the inactive state of the load or the consumer. In other words, there is a reliable decoupling from possible serial cells and the load, which may have an influence on the measurement even when the vehicle is standing still, because otherwise a load influence would also be noticeable even without a load current, since the consumer is contacted and thus would also be measured.

Preferably the first electrical component and the at least one second electrical component constitute a respective electrochemical accumulator, especially of a battery cell for a high-voltage battery, such as a lithium ion cell. As already mentioned at the outset, however, the invention can be used quite analogously for any given kind of electrical component or electrical components which are arranged in a parallel circuit. Examples of such other electrical components are dual-layer capacitors and/or fuel cells. But the invention has especially great benefits in connection with electrochemical energy storages such as battery cells. This is due to the fact that motor vehicles today are being increasingly electrified and have corresponding high-voltage batteries. A monitoring of such high-voltage batteries and especially their individual cells is especially relevant on the one hand from a safety standpoint, and on the other hand for purposes of determining various states and parameters, such as the determination and/or prediction of an aging state or the remaining lifetime of such a high-voltage battery or also the determination of the cell temperature of one or more of the individual cells. The most detailed possible analysis possibilities for the electrical properties of individual battery cells are thus of especially great benefit, in particular for users of such electric vehicles. In the same way, it has also proven to be advantageous to use parallel circuits of individual battery cells in such an assemblage in order to provide a high-voltage battery, since in this way the required power and capacity can be achieved more easily. Hence, the invention offers a special added value for electrical mobility in connection with the determination of the individual complex impedances of battery cells within a parallel circuit.

The measuring unit is correspondingly adapted to perform an electrochemical impedance spectroscopy or impedance determination. Ultimately, the complex impedance can be calculated from current and voltage values, where either the current can be given and the voltage measured, or the current is detected for given voltage. For example, if the complex impedance of a particular battery cell is to be determined, either the other battery cells are temporarily switched out by their associated switching devices from the parallel system or the battery cell itself is switched out, and then the battery cell being measured is excited specifically at its poles, that is, either with a corresponding current or voltage excitation signal having one or more desired excitation frequencies, and the corresponding response to this excitation signal is measured. Thus, for example, if the respective battery cell is excited with a current, especially an alternating current, the voltage response will be measured accordingly by the measuring unit and from the given current excitation and the corresponding voltage response the complex impedance of the battery cell will be determined. In particular, the excitation of the battery cell may occur for different frequencies, and the corresponding response for a particular frequency is also detected by means of the measuring unit and from this the frequency-dependent complex impedance of the respective battery cell can be ultimately calculated. This also holds in general for any given electrical component. Thus, in this way, differences in the complex impedances of the respective battery cells can be advantageously established, which may be for example a sign of different aging processes of the battery cells.

In another especially advantageous embodiment of the invention, the first electrical component and the at least one second electrical component are each designed as part of a cell unit, also called a smart cell in the following, wherein each one of the cell units comprises a first terminal and a second terminal, a battery cell, and a first switch, which is hooked up in series with the battery cell, and a second switch for bridging over the battery cell, which is hooked up in parallel with the battery cell and the first switch. In particular, such a cell unit, particularly a smart cell, may also have an associated control unit, which is adapted to actuate the corresponding first and second switch. Such a smart cell has the major advantage that it makes possible any given and also in particular variable cell configurations in an especially flexible manner, that is, different parallel and/or series circuits. Since such a smart cell furthermore comprises a first switch, which is connected in series with the battery cell as regards the terminals of this smart cell, such a first switch may be used at the same time as the associated switch device for switching out the respective battery cell from the parallel circuit. In other words, when such smart cells are provided as the described electrical components in the parallel circuit with other smart cells, there is no need to provide separate switching devices, because these are already integrated in the functionality of these smart cells any way. Accordingly, when such smart cells are used, the invention can be implemented in especially easy and cost-effective manner, while at the same time these smart cells make possible especially flexible cell configurations.

In another especially advantageous embodiment of the invention, the measurement arrangement comprises an electrical consumer which can be coupled to the parallel circuit and/or an energy-providing component, such as a charging device, wherein the measurement arrangement is adapted to decouple the electrical consumer and/or the component at least from the first component during a measurement cycle in order to determine the first complex impedance of the first component and especially also to determine the complex impedance of another respective electrical component provided in the parallel circuit, or also to decouple it in addition from every other respective electrical component. This has the major advantage that a load like such an electrical consumer and/or components also cannot falsify the measurement results. Hence, the impedance of a particular battery cell or in general that of the particular electrical component can advantageously be measured without load influence. Otherwise, the load, that is, the electrical consumer and/or the component might cause a shift at the working point and also provide noise influence from the motor, the inverter, and further components, which might seriously falsify the measurement result. This advantage is relevant for all kinds of circuitry and not just for parallel battery cells.

Such an aforementioned load and such an electrical consumer may be, for example, a power electronics for an electric motor of the motor vehicle, in which the measurement arrangement is to be applied, and/or also any other electrical consumer, especially a high-voltage consumer, a customary high-voltage onboard network of a motor vehicle, such as an electrical air conditioning compressor, a transformer, and so forth. It is advantageous for at least the battery cell currently being measured to be switched load-free during the measurement cycle. For example, only the individual battery cell currently being measured or also the cell assemblage, that is, the parallel circuit, can be decoupled from the load. A decoupling of the load or the consumer is easily possible by a suitable disconnection switch at least when the consumer is inactive, especially when the motor vehicle is inactive. As an example, if a respective battery cell is to be measured as the electrical component during operation but without load influence, it is advantageous to decouple the battery cell being measured from the other cells in the parallel system and also from the load by opening the switch associated with it, located in series with the particular battery cell being measured, while the other battery cells can then continue to supply the active load with energy. Alternatively, however, the load current through the particular electrical component being measured can also be detected and taken into account during the ascertaining or determining of the impedance of the particular component. Since the other components of the parallel circuit are decoupled during this measurement cycle from the electrical component being measured, advantageously only the current through the particular component can also be detected by the current sensor of the measuring unit.

Furthermore, the invention also relates to a high-voltage battery for a motor vehicle having a measurement arrangement according to the invention or one of its embodiments. Furthermore, the invention also relates to a motor vehicle having a high-voltage battery according to the invention or one of its embodiments. The benefits described for the measurement arrangement according to the invention and its embodiments apply equally to the high-voltage battery according to the invention and the motor vehicle according to the invention.

The motor vehicle according to the invention is preferably an automobile, especially a passenger car or a truck, or designed as a passenger bus or motorcycle.

Furthermore, the invention also relates to a method for determining a first complex impedance of a first electrical component by means of a measurement arrangement having a measuring unit, which is coupled to the first electrical component and adapted to determine the first complex impedance of the first electrical component, especially by means of impedance spectroscopy. At least one second electrical component is arranged with the first electrical component in a parallel circuit, wherein the parallel circuit comprises at least one switching device by means of which an electrical connection between the first electrical component and the at least one second electrical component can be broken, and wherein at least the electrical connection between the first electrical component and the at least one second electrical component is temporarily broken by means of the associated switching device in order to determine the first complex impedance of the first electrical component.

The benefits described for the measurement arrangement according to the invention and its embodiments also apply equally to the method according to the invention.

The invention also includes modifications of the method according to the invention having features such as have already been described in connection with the modifications of the measurement arrangement according to the invention. For this reason, the corresponding modifications of the method according to the invention shall not be again described here.

The invention also encompasses the combinations of the features of the described embodiments.

BRIEF DESCRIPTION OF THE DRAWINGS

In the following, exemplary embodiments of the invention shall be described. For this, there are shown.

DETAILED DESCRIPTION

The following explained exemplary embodiments are preferred embodiments of the invention. In the exemplary embodiments, the described components of the embodiments represent individual features of the invention to be viewed independently of each other, each of them also modifying the invention independently of each other. Therefore, the disclosure will also include other than the represented combinations of the features of the embodiments. Furthermore, the described embodiments may also be amplified with other of the already described features of the invention.

In the figures, the same reference numbers denote functionally identical elements.

Figure 1:
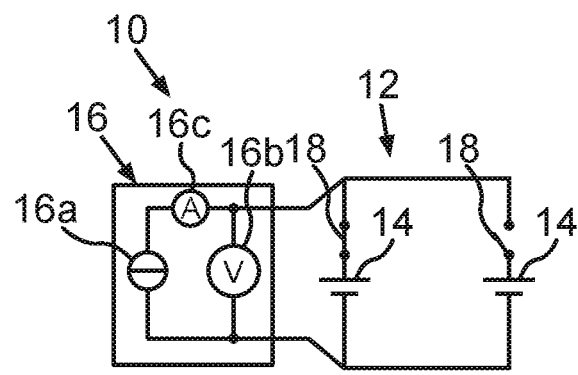
FIG. 1 a schematic representation of a measurement arrangement according to one exemplary embodiment of the invention during a measurement cycle in which a first battery cell is being measured.

FIG. 1 shows a schematic representation of a measurement arrangement 10 for determining a complex impedance according to one exemplary embodiment of the invention. The measurement arrangement 10 comprises a parallel circuit 12 of multiple electrical components, which in this example are designed as battery cells 14. For example, only two battery cells 14 are represented here, but the parallel circuit 12 may also comprise more than two battery cells 14 hooked up in parallel. Furthermore, a measuring unit 16 is hooked up in parallel with this parallel circuit 12. This measuring unit 16 is designed as an impedance measuring unit and is accordingly adapted to perform an electrochemical impedance spectroscopy or impedance determination. In such an electrochemical impedance spectroscopy, the component being measured is subjected to an excitation signal and the corresponding response is measured. In galvanostatic impedance spectroscopy, the excitation signal is a current signal, and in potentiostatic impedance spectroscopy it is a voltage signal.

In the present example, the measuring unit 16 is designed as a galvanostatic measuring unit 16 and accordingly it has a signal source 16a which is adapted to generating a current signal for the excitation, especially an alternating current signal. For the measurement of the voltage response, the measuring unit 16 furthermore has a voltage sensor 16b. Moreover, the measuring unit 16 may also comprise a current sensor 16c, which is merely optional and need not be absolutely provided, especially if the excitation signal generated by the signal source 16a is known and also no other load current is flowing through the parallel circuit 12. Otherwise, the excitation signal generated by the signal source 16a can be detected by the current sensor 16c.

Usually it is not possible to determine the individual impedances of the individual battery cells 14 with a measuring unit such as the described measuring unit 16 when these are present in a traditional parallel circuit. The reason is that the current in parallel-connected cells is distributed among the cells and therefore ultimately only the overall impedance of the system, that is, that of the parallel circuit of multiple cells, can be measured, but not the individual impedance of the respective battery cells.

The invention, on the other hand, now advantageously makes it possible to determine the individual impedances of the respective individual battery cells 14 in the parallel circuit 12, especially in this example with only a single measuring unit 16, as is represented for example in FIG. 1. For this purpose, corresponding switching units are associated with the respective battery cells 14 in the form of switches 18, which may be designed for example as electronically controllable switches, such as MOSFETs. These switches 18 are located in series with respect to the associated battery cell 14. Thus, if one switch 18 of the associated battery cell 14 is opened, the respective battery cell 14 is disconnected from the parallel circuit 12. This may now be used in various ways for the impedance determination of the respective battery cells 14, as shall be explained now with the aid of FIG. 1 and afterwards with the aid of FIG. 5, FIG. 6 and FIG. 7.

In the example of FIG. 1, the right switch 18 is opened, being associated with the right-hand battery cell 14 shown, and the other switch 18 is closed, being associated with the other battery cell 14. Now, if the excitation source 16a of the measuring unit 16 generates an excitation signal in the form of a current signal, especially an alternating current, for example a sinusoidal alternating current, this excitation current will flow only through the first left-hand battery cell 14 and not through the other second battery cell 14 decoupled from the parallel circuit 12. Hence, it is known which current is flowing through this first battery cell 14, and the corresponding voltage response can be measured by means of the voltage sensor 16b. On the other hand, if the excitation signal is unknown, this current excitation can be detected by the current sensor 16c. The impedance of this first battery cell 14 can then be determined advantageously from this excitation current flowing through the battery cell 14 and the associated voltage response, which can be detected by means of the voltage sensor 16b. An ascertaining of the impedance of the battery cell 14 can be done for only one or also for multiple different excitation frequencies, at the same time or in succession. During a first measurement cycle in which this first battery cell 14 is being measured, the second battery cell 14 will thus be decoupled from the parallel circuit 12 by opening its associated switch 18. If the other battery cell 14 is then to be measured, i.e., the battery cell 14 shown at right, its associated switch 18 will be closed and in its place the left switch 18, of the first battery cell 14 shown at left, will be opened and thus switches the first battery cell 14 out from the parallel circuit 12, as illustrated schematically in FIG. 2. Accordingly, the current generated by the excitation source 16a now constitutes the current flowing through the second battery cell 14, and no longer through the first battery cell 14, and also the voltage detected by the voltage sensor 16b constitutes the voltage response of the second battery cell 14. Then, from these quantities, the individual impedance of this second battery cell 14 can be determined in turn, as already described.

Thus, the parallel system can be divided up by a specific disconnecting of battery cells 14. After this, it is possible to measure each individual cell 14. Furthermore, the individual battery cells 14 may also be designed as so-called smart cells, i.e., intelligent battery cells or intelligent cell units 20, as represented for example in FIG. 3 as part of a measurement arrangement 10 according to another exemplary embodiment of the invention. Here as well, there are once more two battery cells 14 in a parallel circuit 12 with each other, and the measuring unit 16, which can be designed like the previously described measuring unit 16, is once again hooked up in parallel with this parallel circuit 12. The individual battery cells 14 in this example are part of a respective intelligent battery cell unit 20 or a smart cell 20. Such a cell unit 20 comprises, in addition to the battery cell 14, two switches 18, 22. Moreover, for the actuating of the switches, the smart cell 20 may furthermore comprise a control unit or control electronics, not explicitly shown here. A first switch 18 is once again switched in series with the respective battery cell 14, and a second switch 22 is switched in parallel with the arrangement of battery cell 14 and first switch 18 and can thus bridge over the battery cell 14. This second switch 22 is thus part of a bypass circuit for bridging over the respective battery cell 14. Hence, in order to bridge over a battery cell 14, this bypass switch or the second switch 22 is closed and the first switch 18 is opened. However, this second switch 22 is less relevant in the present instance. Such a configuration of a battery cell or cell unit 20 has the major advantage that it provides very many flexible circuitry possibilities as regards the mutual arrangement of cells 14 in a cell assemblage. Since such smart cells 20 have a first switch 18 hooked up in series with the battery cell 14 any way, these cell units 20 can now also be used especially advantageously for the individual measurement of the impedances of the respective battery cells 14. As already described for FIG. 1 and FIG. 2, for corresponding measurements of the first battery cell 14 it is possible once again to close the associated switch 18 hooked up in series with it and to open the switch 18 which is associated with the second battery cell 14 and hooked up in series with it and thus disconnect the second battery cell 14 from the parallel circuit 12. The reverse applies when the second battery cell 14 is to be measured. Hence, in such a smart cell concept consisting of two switches 18, 22 per battery cell 14, such an impedance measurement, especially an individual impedance measurement, is easily possible by dividing up the electrical connection or the parallel circuit 12.

Figure 3:
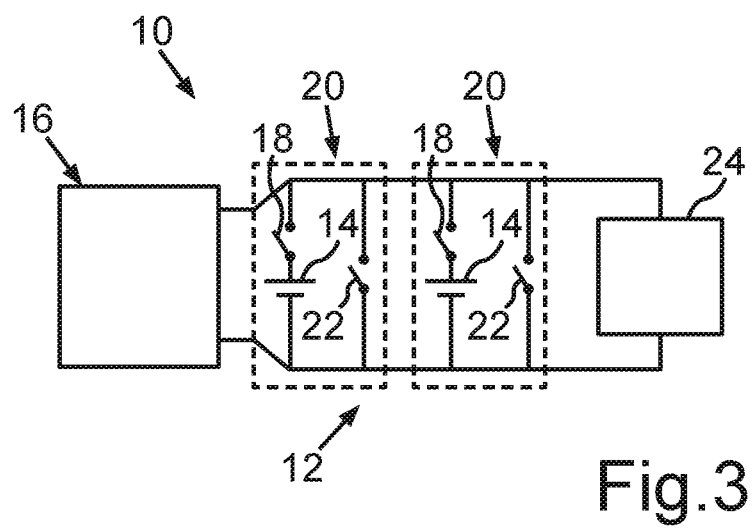
FIG. 3 a schematic representation of a measurement arrangement with a parallel circuit of multiple battery cells and a load coupled to the parallel circuit according to one exemplary embodiment of the invention.

Furthermore, in the example represented in FIG. 3 a load 24 is also hooked up in parallel with the parallel circuit 12. This load 24 may also be composed of multiple individual consumers, such as high-voltage onboard network consumers like power electronics, electrical air conditioning compressor, a DC/DC converter, and so forth. If such a load 24 is coupled with a particular battery cell 14 during a measurement cycle for the measurement of that battery cell 14 and a corresponding load current flows accordingly through that battery cell 14, this may falsify the measurement result. Therefore, it is preferable to measure a battery cell 14 without load influence. This can be realized by disconnecting such a load, for example one or more of the mentioned consumers, at least from the battery cell 14 being currently measured and/or also from the entire parallel circuit 12 during the respective measurement cycles.

Figure 2:
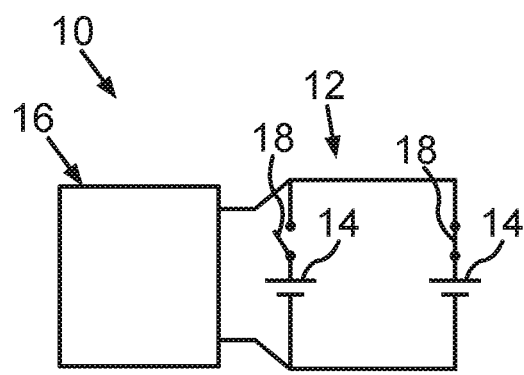
FIG. 2 a schematic representation of the measurement arrangement of FIG. 1 according to one exemplary embodiment of the invention during a measurement cycle in which a second battery cell, hooked up in parallel to the first battery cell, is being measured.
Figure 4:
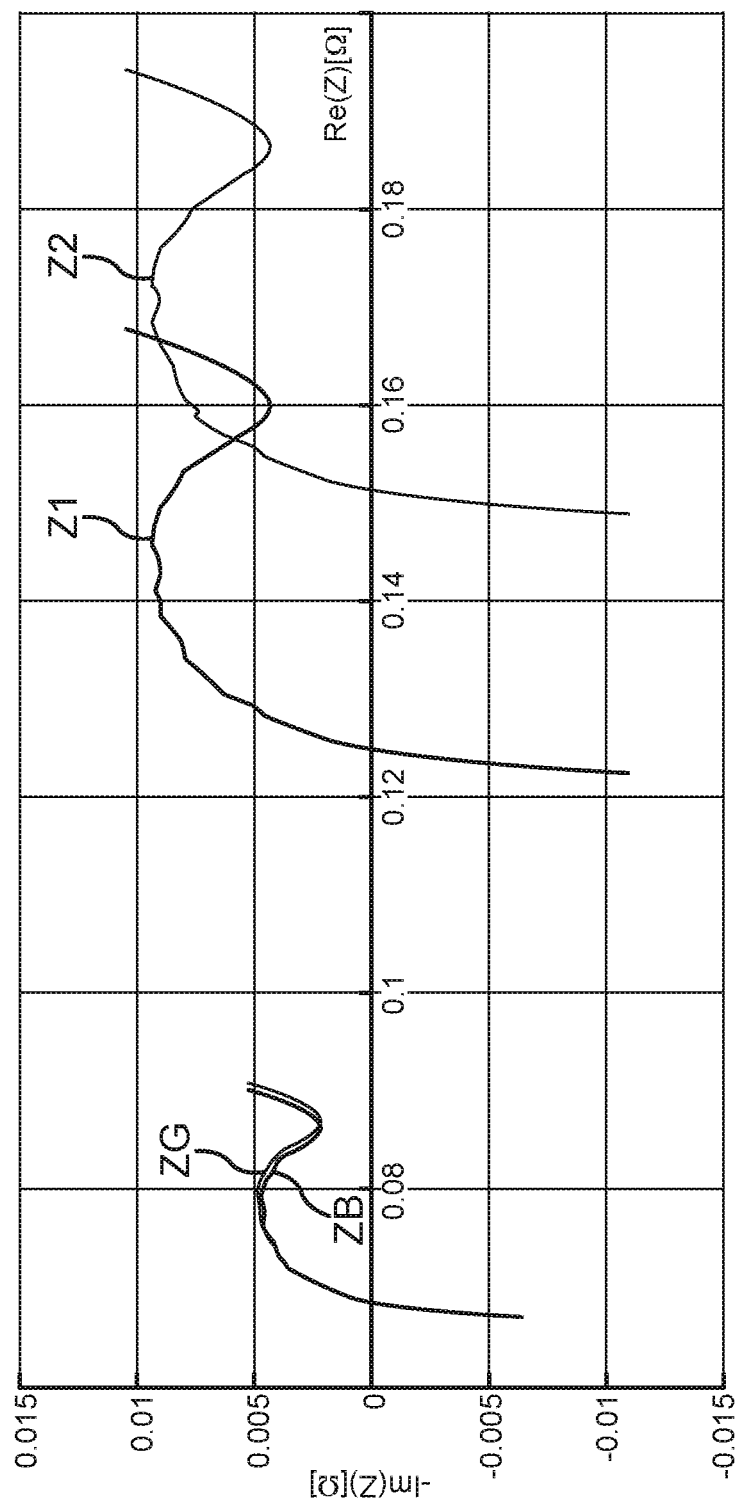
FIG. 4 a Nyquist diagram to illustrate the ascertained first impedance of the first battery cell, the ascertained second impedance of the second battery cell and the overall impedance of the parallel circuit, according to one exemplary embodiment of the invention.

The result of the impedance measurements is illustrated in FIG. 4. FIG. 4 shows a Nyquist diagram, in which the real part Re of an impedance Z is plotted on the abscissa in Ohm units Ω, and the imaginary part Im of the impedance Z is likewise plotted on the ordinate in Ohm units Ω. Z1 represents the measurement result of the measurement of the first battery cell 14, as shown in FIG. 1; the curve Z2 represents the measurement result of the measurement of the second battery cell 14, as shown in FIG. 2; and ZG represents a measurement result of a measurement of both parallel-connected battery cells 14 when the two associated switches 18 are closed at the same time. As can be seen by comparing the two curves Z1 and Z2, the right battery cell 14, that is, the second battery cell 14 associated with the second impedance curve Z2, has a distinctly larger ohmic resistance, which in turn represents the real part Re of the measured impedance, than the left battery cell 14, that is, the first battery cell 14, which may be a sign of intense aging of the second battery cell 14, for example.

With the mathematical methods of network theory, the overall impedance with closed switches 18 is also calculated from the first and the second impedance curve Z1, Z2, illustrated by the curve ZB. The result of the calculation ZB shows that the overall impedance is composed of the individual impedances Z1, Z2, since the calculated values ZB reproduce almost completely the measurement curve for the overall impedance ZG. In other words, the calculated overall impedance ZB agrees very well with the measured overall impedance ZG. However, a back calculation from the overall impedance, illustrated by the curve ZG, to the individual impedance values of the respective battery cells 14, illustrated by the two curves Z1 and Z2, is not possible, which is why the described circuitry concept represents the optimal possibility of determining individual cell impedances Z1, Z2.

The determination of the individual impedances Z1, Z2, as described for example for the two battery cells 14, can be used entirely analogously for any given number of battery cells 14 arranged in the parallel circuit 12 and hooked up in parallel with each other.

Figure 5:
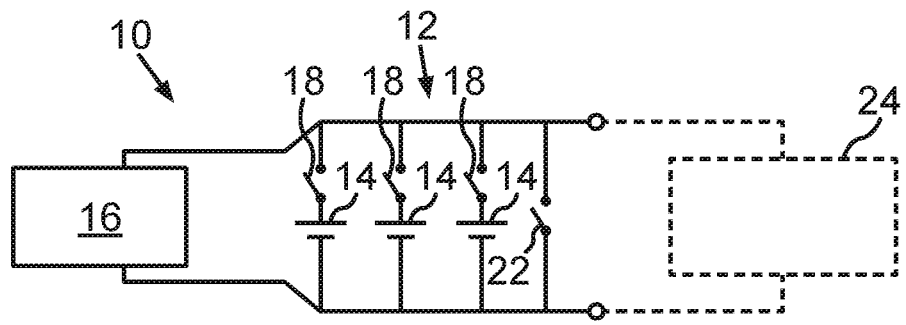
FIG. 5 a schematic representation of a measurement arrangement according to another exemplary embodiment of the invention.

For example, FIG. 5 shows a circuitry and measurement layout analogous to FIG. 1, FIG. 2 and FIG. 3 with more than two battery cells 14, in particular, with three battery cells 14 as an example. The determination of the impedance of the respective battery cells 14 can thus be done as described above. In this variant, an isolated measurement of a single cell 16 is only possible if the load 24 is disconnected or the load path contains an electrical interruption. If the measurement is done during operation (load/charging) without electrical interruption, the cell 14 being measured must furthermore account for the entire energy and power demand in the parallel system 12 and is therefore not at rest. The bypass switch represented in FIG. 5 and denoted as 22 cannot be used during the measurement, or else a short circuit will occur.

Figure 6:
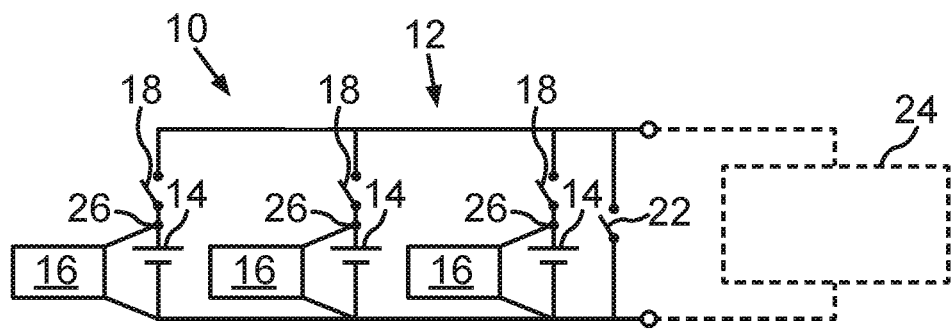
FIG. 6 a schematic representation of a measurement arrangement with multiple respective battery cells of associated measuring units for determining the complex impedances according to another exemplary embodiment of the invention.

FIG. 6 shows a schematic representation of a measurement arrangement 10 for determining a complex impedance according to another exemplary embodiment of the invention. The measurement arrangement 10 once again comprises a parallel circuit 12 of multiple electrical components, which in this example are again designed as battery cells 14. For example, three battery cells 14 are once again represented here, but the parallel circuit 12 may also comprise more battery cells 14 hooked up in parallel with each other. Once again, the respective battery cells 14 are associated with corresponding switching units in the form of switches 18, which can be designed for example as electronically controllable switches, such as MOSFETs. These switches 18 are again in series with respect to the associated battery cell 14. By contrast with the previous examples, a measuring unit 16 is now associated with each of the battery cells 14 and hooked up in parallel with the associated battery cell 14. These measuring units 16 may be designed like the previously described measuring unit of FIG. 1 and comprise corresponding 6a, components, such as an excitation source 16a, a current sensor 16c and a voltage sensor 16b.

A respective measuring unit 16 is now coupled or can be coupled to a measuring tap 26 for determining the complex impedance of the associated battery cell 14, which tap is situated between the associated battery cell 14 and the switch 18 associated with the associated battery cell 14. Furthermore, the measurement arrangement 10 is adapted, in order to determine the complex impedance of the associated battery cell 14, to disconnect it temporarily by means of the associated switch 18 from the parallel circuit 12 and thereby to decouple it from the other battery cells 14, so that the disconnected battery cell 14 can now be measured uninfluenced by a current flow through the parallel circuit 12. In other words, the battery cell 16 being measured is in this way specifically decoupled by means of the associated switch 18 during the measurement phase from the rest of the parallel system 12 and after this it is again switched back in. A second measuring tap of the measuring unit can be located at an opposite side of the associated battery cell, and thus the first measuring tap 26 is coupled to a positive cell potential of the battery cell 14 and a second measuring tap is coupled to a negative cell potential of the battery cell 14.

Although multiple measuring units 16 are required in this variant, advantageous it is also possible to measure multiple or all of the battery cells 14 at the same time by the respective associated measuring units 16 and thus to determine their impedances. Furthermore, the battery cell 14 being measured is also decoupled from the load 24 during the measurement phase and can thus be measured advantageously without load influence, even during operation, since the other cells not currently being measured can provide for the drive operation.

Figure 7:
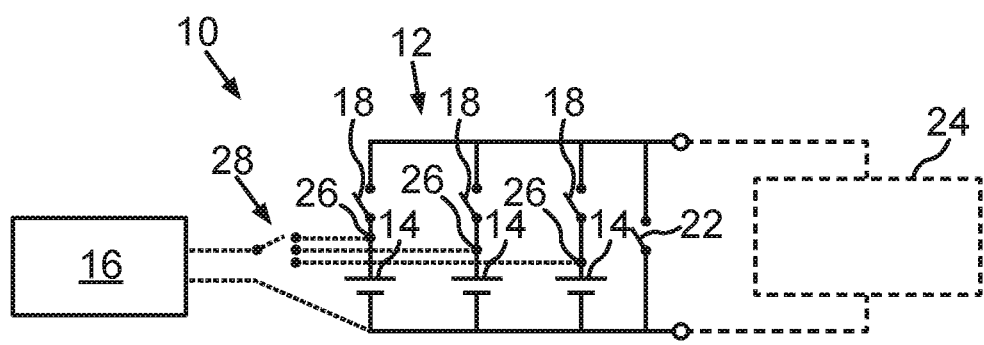
FIG. 7 a schematic representation of a measurement arrangement with a measuring unit which can be coupled in time sequence by means of a selector switch unit to respective measuring taps, arranged between a battery cell and the switch associated with the battery cell, in order to determine the impedances of the respective battery cells in time sequence.

FIG. 7 shows a schematic representation of a measurement arrangement 10 for determining a complex impedance according to another exemplary embodiment of the invention. The measurement arrangement 10 once again comprises a parallel circuit 12 of multiple electrical components, which in this example are again designed as battery cells 14. For example, three battery cells 14 are once again represented here, but the parallel circuit 12 may also comprise more battery cells 14 hooked up in parallel with each other. Once again, the respective battery cells 14 are associated with corresponding switching units in the form of switches 18, which can be designed for example as electronically controllable switches, such as MOSFETs. These switches 18 are again in series with respect to the associated battery cell 14.

In this example, once again only one measuring unit 16 is provided, which can be configured as described above and may comprise corresponding components such as an excitation source 16a, a current sensor 16c and a voltage sensor 16b. By contrast with the previous examples, this measuring unit 16 can be coupled by means of a selector switch unit 28, such as a kind of multiplexer, in time sequence to the associated measuring taps 26 of the respective battery cells 14, which again are located between the respective battery cells 14 and their associated switches 18, in order to determine the impedances of the respective battery cells 14 in time sequence. The measuring unit 16 is now coupled, for the determining of the complex impedance of the associated battery cell 14, to the measuring tap 26 which is arranged between the battery cell 14 being measured and the switch assigned to the battery cell 14 being measured. Furthermore, the measurement arrangement 10 is adapted, in order to determine the complex impedance of the battery cell 14, to disconnect it temporarily by means of the associated switch 18 from the parallel circuit 12 and thereby to decouple it from the other battery cells 14, so that the disconnected battery cell 14 can now be measured uninfluenced by a current flow through the parallel circuit 12. In other words, the battery cell 14 being measured is in this way specifically decoupled by means of the associated switch 18 during the measurement phase from the rest of the parallel system 12 and after this it is again switched back in.

In this variant, once again only one measuring unit 16 is advantageously required, while the battery cell 14 being measured is likewise decoupled from the load 24 during the measurement phase, since the associated switch 18 is opened during the measuring of the respective battery cell 14, so that this battery cell 14 can again be measured advantageously during operation and still without any load influence.

Another advantageous functionality is produced by incorporating at least one bypass switch per parallel system 12, denoted as 22 in FIG. 5, FIG. 6 and FIG. 7. By bridging over an entire parallel string of cells 14 in a cell assemblage of serially connected parallel systems 12, this bridged-over parallel system 12 can be measured individually during the operation (load/charging) of the battery system. By this method, all the parallel-connected cells 14 can be measured at the same time in the variant represented in FIG. 6.

On the whole, the examples show how the invention can provide an impedance measurement of parallel-connected battery cells, enabling a highly accurate determination of the state of all battery cells in the battery system, which can be done without external influences from other cells or a load, even during operation.

The invention claimed is:

1. A measurement arrangement for determining a first complex impedance of a first electrical component, wherein the measurement arrangement comprises:
   the first electrical component and a measuring unit, which is coupled to the first electrical component and adapted to determine the first complex impedance of the first electrical component,
   wherein the measurement arrangement comprises at least one second electrical component, which is arranged with the first electrical component in a parallel circuit, which is hooked up in parallel with the measuring unit, wherein the parallel circuit comprises at least one switching device operable by the measuring arrangement by which an electrical connection between the first electrical component and the at least one second electrical component can be broken, and wherein the measurement arrangement is designed to temporarily break at least the electrical connection between the first electrical component and the at least one second electrical component by the associated switching device in order to determine the first complex impedance of the first electrical component, and
   wherein the at least one switching device constitutes at least one switching device which is associated with a respective one of the at least one second electrical component, by which the associated at least one second electrical component can be switched out from the parallel circuit, wherein the measurement arrangement is adapted to switch the at least one second electrical component by the associated switching device temporarily out from the parallel circuit in order to determine the first complex impedance of the first electrical component.

2. The measurement arrangement according to claim 1, wherein the first electrical component is associated with a switching device, by which the associated first electrical component can be switched out from the parallel circuit, wherein the measurement arrangement is adapted to determine at least one second complex impedance of the at least one second electrical component and to switch the first electrical component by the associated switching device temporarily out from the parallel circuit in order to determine the at least one second complex impedance of the at least one second electrical component.

3. The measurement arrangement according to claim 2, wherein the measurement arrangement comprises more than two electrical components including the first and the at least one second component in the parallel circuit, and the measuring unit is adapted to determine separately the complex impedance of a respective component.

4. The measurement arrangement according to claim 2, wherein the at least one switching device is associated with the first electrical component and hooked up in series with the first electrical component, wherein the measuring unit has a measuring tap for determining the first complex impedance of the first electrical component, which measuring tap is arranged between the first electrical component and the switching device associated with the first electrical component, and wherein the measurement arrangement is adapted to switch the first electrical component by the associated switching device temporarily out from the parallel circuit in order to determine the first complex impedance of the first electrical component.

5. The measurement arrangement according to claim 2, wherein the first electrical component and the at least one second electrical component are each designed as part of a cell unit, wherein each one of the cell units comprises a first terminal and a second terminal, a battery cell, and a first switch, which is hooked up in series with the battery cell, and a second switch for bridging over the battery cell, which is hooked up in parallel with the battery cell and the first switch.

6. The measurement arrangement according to claim 2, wherein the measurement arrangement comprises an electrical consumer which can be coupled to the parallel circuit and/or an energy-providing component, wherein the measurement arrangement is adapted to decouple the electrical consumer and/or the component at least from the first component during a measurement cycle in order to determine the first complex impedance of the first component.

7. The measurement arrangement according to claim 1, wherein the measurement arrangement comprises more than two electrical components including the first and the at least one second component in the parallel circuit, and the measuring unit is adapted to determine separately the complex impedance of a respective component.

8. The measurement arrangement according to claim 7, wherein the at least one switching device is associated with the first electrical component and hooked up in series with the first electrical component, wherein the measuring unit has a measuring tap for determining the first complex impedance of the first electrical component, which measuring tap is arranged between the first electrical component and the switching device associated with the first electrical component, and wherein the measurement arrangement is adapted to switch the first electrical component by the associated switching device temporarily out from the parallel circuit in order to determine the first complex impedance of the first electrical component.

9. The measurement arrangement according to claim 7, wherein the first electrical component and the at least one second electrical component are each designed as part of a cell unit, wherein each one of the cell units comprises a first terminal and a second terminal, a battery cell, and a first switch, which is hooked up in series with the battery cell, and a second switch for bridging over the battery cell, which is hooked up in parallel with the battery cell and the first switch.

10. The measurement arrangement according to claim 7, wherein the measurement arrangement comprises an electrical consumer which can be coupled to the parallel circuit and/or an energy-providing component, wherein the measurement arrangement is adapted to decouple the electrical consumer and/or the component at least from the first component during a measurement cycle in order to determine the first complex impedance of the first component.

11. The measurement arrangement according to claim 1, wherein the at least one switching device is associated with the first electrical component and hooked up in series with the first electrical component, wherein the measuring unit has a measuring tap for determining the first complex impedance of the first electrical component, which measuring tap is arranged between the first electrical component and the switching device associated with the first electrical component, and wherein the measurement arrangement is adapted to switch the first electrical component by the associated switching device temporarily out from the parallel circuit in order to determine the first complex impedance of the first electrical component.

12. The measurement arrangement according to claim 11, wherein the first electrical component and the at least one second electrical component are each designed as part of a cell unit, wherein each one of the cell units comprises a first terminal and a second terminal, a battery cell, and a first switch, which is hooked up in series with the battery cell, and a second switch for bridging over the battery cell, which is hooked up in parallel with the battery cell and the first switch.

13. The measurement arrangement according to claim 1, wherein the first electrical component and the at least one second electrical component are each designed as part of a cell unit, wherein each one of the cell units comprises a first terminal and a second terminal, a battery cell, and a first switch, which is hooked up in series with the battery cell, and a second switch for bridging over the battery cell, which is hooked up in parallel with the battery cell and the first switch.

14. The measurement arrangement according to claim 1, wherein the measurement arrangement comprises an electrical consumer which can be coupled to the parallel circuit and/or an energy-providing component, wherein the measurement arrangement is adapted to decouple the electrical consumer and/or the component at least from the first component during a measurement cycle in order to determine the first complex impedance of the first component.

15. A method for determining a first complex impedance of a first electrical component by means of a measurement arrangement having a measuring unit, which is coupled to the first electrical component and determines the first complex impedance of the first electrical component, wherein
at least one second electrical component is arranged with the first electrical component in a parallel circuit, which is hooked up in parallel with the measuring unit, wherein the parallel circuit comprises at least one switching device by which an electrical connection between the first electrical component and the at least one second electrical component can be broken, and wherein at least the electrical connection between the first electrical component and the at least one second electrical component is temporarily broken by the associated switching device in order to determine the first complex impedance of the first electrical component, and
wherein the at least one switching device constitutes at least one switching device which is associated with a respective one of the at least one second electrical component, by which the associated at least one second electrical component can be switched out from the parallel circuit, wherein the measurement arrangement is adapted to switch the at least one second electrical component by the associated switching device temporarily out from the parallel circuit in order to determine the first complex impedance of the first electrical component.

\* \* \* \* \*